United States Patent
Takenaka et al.

[11] Patent Number: 5,523,595
[45] Date of Patent: Jun. 4, 1996

[54] SEMICONDUCTOR DEVICE HAVING A TRANSISTOR, A FERROELECTRIC CAPACITOR AND A HYDROGEN BARRIER FILM

[75] Inventors: Kazuhiro Takenaka; Akira Fujisawa, both of Suwa, Japan

[73] Assignee: Ramtron International Corporation, Colorado Springs, Colo.

[21] Appl. No.: 238,802

[22] Filed: May 6, 1994

Related U.S. Application Data

[63] Continuation of Ser. No. 848,995, filed as PCT/JP91/01105, Aug. 20, 1991, published as WO92/03849, Mar. 5, 1992, abandoned.

[30] Foreign Application Priority Data

Aug. 21, 1990 [JP] Japan .................... 2-220905

[51] Int. Cl.[6] .................................... H01L 29/68
[52] U.S. Cl. .................. 257/295; 257/310; 257/637
[58] Field of Search .................... 257/298, 774, 257/641, 295, 310, 637, 640, 646

[56] References Cited

U.S. PATENT DOCUMENTS

| | | | |
|---|---|---|---|
| 4,675,715 | 6/1987 | Lepselter et al. | 257/915 |
| 4,811,078 | 3/1989 | Tigelaar et al. | 257/915 |
| 4,959,745 | 9/1990 | Suguro | 361/11 |
| 5,070,036 | 12/1991 | Stevens | 437/190 |
| 5,119,154 | 6/1992 | Gnadinger | 257/298 |
| 5,319,246 | 6/1994 | Nagamine et al. | 257/774 |

FOREIGN PATENT DOCUMENTS

| | | | |
|---|---|---|---|
| 57-48247 | 3/1982 | Japan | 257/641 |
| 59-105364 | 6/1984 | Japan . | |
| 59-110122 | 6/1984 | Japan | 257/641 |
| 60-100464 | 6/1985 | Japan | 257/915 |
| 62-23149 | 1/1987 | Japan . | |
| 63-028069 | 7/1988 | Japan | H01L 29/78 |
| 1-265524 | 10/1989 | Japan . | |
| 1-253257 | 10/1989 | Japan . | |
| 1-241860 | 12/1989 | Japan | H01L 27/04 |
| 2-183567 | 7/1990 | Japan . | |
| 2-184079 | 7/1990 | Japan . | |

*Primary Examiner*—Jerome Jackson
*Assistant Examiner*—Courtney A. Bowers
*Attorney, Agent, or Firm*—Edward D. Manzo; Mark J. Murphy; Peter J. Meza

[57] ABSTRACT

A semiconductor device having a ferroelectric film or a polycrystalline silicon gate, a humidity-resistant hydrogen barrier film, like TiN film, TiON film, etc., formed by hydrogen non-emission film forming method over the ferroelectric film or the polycrystalline silicon gate.

16 Claims, 4 Drawing Sheets

SEMICONDUCTOR DEVICE HAVING A TRANSISTOR, A FERROELECTRIC CAPACITOR AND A HYDROGEN BARRIER FILM

This is a continuation of application Ser. No. 07/848,995, filed as PCT/JP91/01105, Aug. 20, 1991, published as WO92/03849, Mar. 5, 1992, now abandoned.

FIELD OF THE INVENTION

The present invention relates to a semiconductor device and a method of manufacturing the same, and more particularly to a protective film structure and a method of forming the protective film in a semiconductor memory having a capacitor structure with a ferroelectric film such as PZT (Pb(Ti,Zr,)$O_3$) or the like, and a CMOS semiconductor integrated circuit with polycrystalline silicon gates.

BACKGROUND OF THE INVENTION

A semiconductor non-volatile memory cell having a storage capacitor with a ferroelectric comprises a structure as shown in FIG. 6. This memory cell is made by connecting in series a single transfer gate transistor (MOS transistor) T to a storage capacitor (condenser) C having a ferroelectric film. The transfer gate transistor T comprises a polysilicon gate 3 formed on a p-type semiconductor substrate 1 via a gate insulating film 2. Source and drain regions 4 and 5 are high concentration n-type regions formed by self-aligning on the surface side of the p-type semiconductor substrate 1 using the polycrystalline silicon gate 3 as a mask. Moreover, either the source region 4 or the drain region 5 is connected to a bit line, and the polycrystalline silicon gate 3 is connected to a word line, respectively.

The storage capacitor C is constructed on a LOCOS (local oxidized film) 6 as a field oxide film. On the LOCOS 6 and the polycrystalline silicon gate 3 is formed a first interlayer insulating film 7 of $SiO_2$ by CVD or sputtered SiN. On interlayer insulating film 7, a lower plate electrode 8 of platinum (Pt) is formed above the LOCOS 6 by a sputtering method. On a part of the lower plate electrode 8, a dielectric film 9 is formed. Dielectric film 9 comprises PZT (Pb(Ti$_x$Zr$_y$)$O_3$) as a ferroelectric and is formed by a sputtering method or a spin coat method. On the dielectric film 9 is formed an upper plate electrode 10 of platinum by a sputtering method.

Then, on the first interlayer insulating film 7 is formed a second interlayer insulating film 11 of $SiO_2$ by CVD or sputtered $SIN_2$, and on the interlayer insulating film 11 is formed an Al wiring by a sputtering method. The Al wiring 12a is an inner cell wiring for connecting the drain region 5 and the upper plate electrode 10 via a contact hole, and the Al wiring 12b is an earth wiring connecting the lower plate electrode 8 and a pad portion (not shown). Moreover, not shown in FIG. 6, the word line connected to the polycrystalline silicon gate 3 and the bit line connected to the source region 4 are formed using the same Al wiring layer 12. On the Al wirings 12a and 12b is formed a passivation film 13 by sputtering SiN.

PZT (Pb(Ti$_x$Zr$_y$)$O_3$) used as a ferroelectric in the dielectric film 9 has a hysteresis curve to an electric field, and continually maintains residual polarization when a write-in voltage is removed, so as to be utilized as a non-volatile memory as described above. It can also be utilized as a dynamic RAM capacitor because its dielectric constant is about 1000, which is more than two orders of magnitude larger than the $SiO_2$ film.

However, when exposed to hydrogen, the value of the residual polarization is reduced, and a width (margin) of binary logic necessary for a memory function becomes narrow. Moreover, the value of the dielectric constant is lowered. Such property deterioration results in the lowering of yield, so that it is necessary to consider a film forming method for preventing the dielectric film 9 from exposure to hydrogen after the process of forming the dielectric film 9.

In the formation of SiN by a plasma CVD method and $SiO_2$ by a normal or reduced pressure CVD method, these films are formed in a hydrogen atmosphere. If they are formed on the upper portion of the dielectric film 9, hydrogen enters into the dielectric film 9 causing deterioration in the film's properties. Thus, these film forming methods cannot be employed. Therefore, in the structure of the above-described prior art non-volatile memory, the second interlayer insulating film 11 and the passivation film 13 are SiN films formed by a sputtering method, since this method emits no hydrogen. On the other hand, the passivation film 13 essentially requires a humidity-resisting dense film quality, but the SiN film formed by a sputtering method lacks film denseness. Therefore, it is poor in humidity resistance and is inconvenient as a passivation film.

An object of the present invention is to solve the above problems, and to provide a semiconductor device and a method of manufacturing the same requiring a ferroelectric film having high residual polarization and dielectric constants by employing a method for forming a film over the upper portion of a ferroelectric film to prevent hydrogen from entering into the ferroelectric film.

SUMMARY OF THE INVENTION

The present invention is directed a humidity-resisting hydrogen barrier film over the upper portion of a ferroelectric film formed by a sputtering method or a hydrogen non-emissible film, forming method in a semiconductor device including a capacitor with a ferroelectric having poor resistance to hydrogen such as PZT and the like. A coating range of this hydrogen barrier film is not limited to only the entire surface of the semiconductor device, but also preferably within a range coating a capacitor structure. The hydrogen barrier film may preferably be a TiN film formed by a sputtering method or oxygen penetration type TiON. A method of forming a TiON film provides for plasma treatment or heat treatment of a TiN film in an oxygen atmosphere, a sputtering method using a Ti target in a nitrogen or oxygen atmosphere, and a sputtering method of TiON. TiON is conductive when the oxygen content is low and insulative when the oxygen content is high. Moreover, a TiON film having a high oxygen content has great oxygen stopping power.

The present invention uses a structure having a coating of a corrosion-resistant film (SiN by plasma CVD method, $SiO_2$ by normal pressure or reduced pressure CVD method and the like) on the hydrogen barrier film directly or via an interlayer insulating film.

When a humidity-resisting hydrogen barrier film formed by a hydrogen non-emissible film forming method is coated on the upper portion of a ferroelectric film, after the formation of the ferroelectric film, it is possible to prevent hydrogen generated in the process from penetrating into the ferroelectric film and to avoid lowering the residual polarization and dielectric constants. Therefore, it is possible to obtain a semiconductor device having a ferroelectric film with high residual polarization and dielectric constants. A corrosion-resistant film on the upper portion of a hydrogen barrier film can prevent corrosion of the hydrogen barrier film. This corrosion-resistant film requires film denseness, so that it is necessary to depend mainly upon forming the film by a CVD method and film forming method of hydrogen emission. However, since the hydrogen barrier film exists in a sublayer, there is no problem of hydrogen penetrating into the ferroelectric.

The above manufacturing methods are widely used means, but in case of forming an insulating (high oxygen content) TiON film as a hydrogen barrier film, the above-step of forming a corrosion-resisting film can be eliminated.

DETAILED DESCRIPTION OF THE PRESENTLY PREFERRED EMBODIMENTS

Embodiments of the present invention are explained by referring to the accompanying drawings as follows.

First Embodiment

Figure 1:
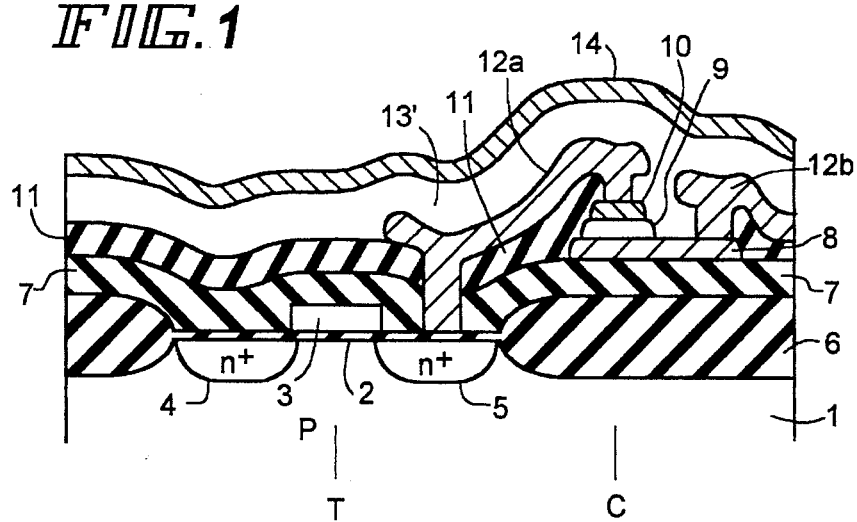
FIG. 1 is a cross section showing a structure of a semiconductor memory relating to a first embodiment of the present invention.

FIG. 1 is a cross section showing a semi-conductor memory relating to a first embodiment of the present invention. On the surface of a p-type semiconductor substrate 1 are formed a gate insulating film 2 by thermal oxidation and LOCOS (local oxide film) 6 of a thick oxide film for dividing and forming an active region of a MOS. A transfer transistor T comprises a polycrystalline silicon gate 3 formed over the gate insulating film 2. Source and drain regions 4 and 5 are high concentration n-type regions formed by self-alignment on the surface side of the p-type semiconductor substrate 1 with the use of the polycrystalline silicon gate 3 as a mask. A storage capacitor C is constructed on the LOCOS 6.

On the LOCOS 6 and the polycrystalline silicon gate 3 is completely formed a dense first interlayer insulating film ($SiO_3$ or SiN) 7 by CVD. Then, on the interlayer insulating film 7 above the LOCOS 6 is formed a lower plate electrode 8 of platinum (Pt) by a sputtering method. On part of the lower plate electrode 8 is formed a dielectric film 9 of PZT ($Pb(Ti_xZr_y)O_3$) as a ferroelectric by a sputtering method or another method of application. On the dielectric film 9 is formed an upper plate electrode 10 of platinum by a sputtering method, and a storage capacitor C is obtained.

On the first interlayer insulating film 7 is also formed a second interlayer insulating film (lower interlayer insulating film) 11 of SiN by a sputtering method. Contact holes are etched at positions of the region 5, the upper plate electrode 10 and the lower plate electrode 8.

On the interlayer insulating film 11 are formed Al wirings by a sputtering method. An Al wiring 12a is a cell interior wiring connecting the region 5 and the upper plate electrode 10 via the contact hole, and an Al wiring 12b is an earth wiring connecting the lower plate electrode 8 and a pad portion (not shown). Moreover, not shown in FIG. 1, a word line connected to the polycrystalline silicon gate 3 and a bit line connected to the region 4 are formed on the same layer as the Al wirings.

On the Al wirings 12a and 12b is formed a third interlayer insulating film (upper interlayer insulating film) 13' of SiN by a sputtering method. It is a matter of course that hydrogen is not emitted in this process, so that there is no deterioration of the dielectric film 9. The third interlayer insulating film 13' lacks denseness and is therefore not suitable as a final passivation film, as stated later on, and has significance as an interlayer insulating film between a conductive humidity-resisting hydrogen barrier 14 and the Al wirings 12a and 12b.

On the third interlayer insulating film 13' is formed a TiN film as a humidity-resisting hydrogen barrier film 14 by a sputtering method. In this film forming process, hydrogen is not generated and deterioration of the dielectric film 9 does not occur. It has been found that this TiN film is preferable as a hydrogen barrier film 14. In semiconductor techniques in general, the TiN film is known as barrier metal of silicon and Al, but this TiN film is a highly dense, non-porous conductive film, so that it is a humidity-resistant film and a hydrogen non-permeable protective film. It serves as an electromagnetic shield since it is conductive. This titanium nitride (TiN) can be oxidized to be an oxygen penetration type TiON. TiON having a high oxygen content has a higher oxygen non-permeability and is excellent as a hydrogen barrier film. Therefore, as this hydrogen barrier film 14, a TiON film may be preferable. As a method of forming a TiON film, either one of the following methods can be employed:

(1) Plasma treatment of a TiN film in an oxygen atmosphere;

(2) Heat treatment of a TiN film in an oxygen atmosphere;

(3) Sputtering method in an $N_2$, $O_2$ atmosphere by Ti target; or (4) Sputtering method of TiON.

Moreover, TiON as a hydrogen barrier film has a high oxygen content, is not conductive and does not require formation of the interlayer insulating film 13'.

The hydrogen barrier film 14 is a TiN film or a Tion film and has conductivity in general, but oxygen penetration type TiON has conductivity when the oxygen content is low and has insulation properties when the oxygen content is high.

Second Embodiment

Figure 2:
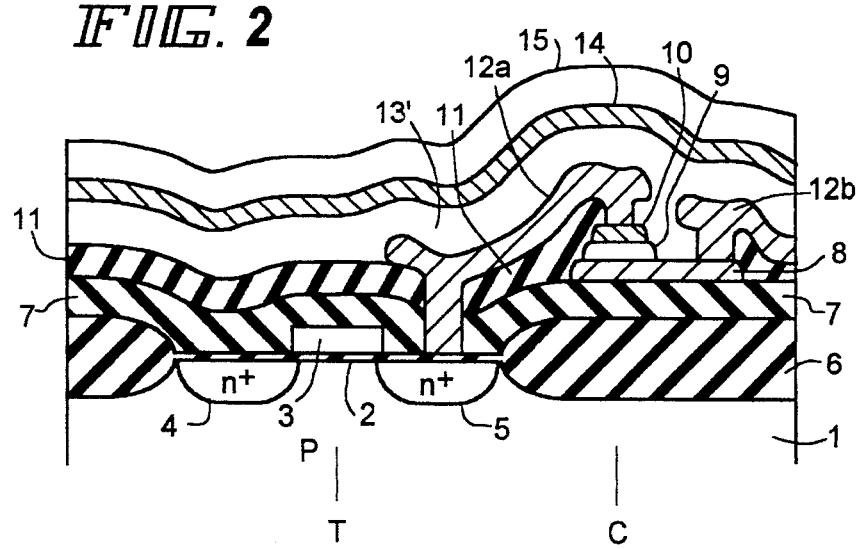
FIG. 2 is a cross section showing a structure of a semiconductor memory relating to a second embodiment of the present invention.

FIG. 2 is a cross section showing a semiconductor memory relating to a second embodiment of the present invention. Moreover, like parts shown in FIG. 1 are presented by like reference symbols in FIG. 2 and their explanation is omitted.

In this embodiment, on the hydrogen barrier film 14 is formed an SiN film by a plasma CVD method or a corrosion-resistant film 15 of a $SiO_2$ film by a normal or reduced pressure CVD method. This film has a high density and is non-porous and prevents penetration of humidity to prevent corrosion of the hydrogen barrier film 14. The method of forming the SiN film by a plasma CVD method or the SiO$_2$ film by a normal or reduced pressure CVD method is a chemical reaction process that generates hydrogen and may also be performed in a hydrogen atmosphere, but the hydrogen penetration is prevented by the already formed hydrogen barrier film 14, and does not cause an influence upon the dielectric film 9.

Third Embodiment

Figure 3:
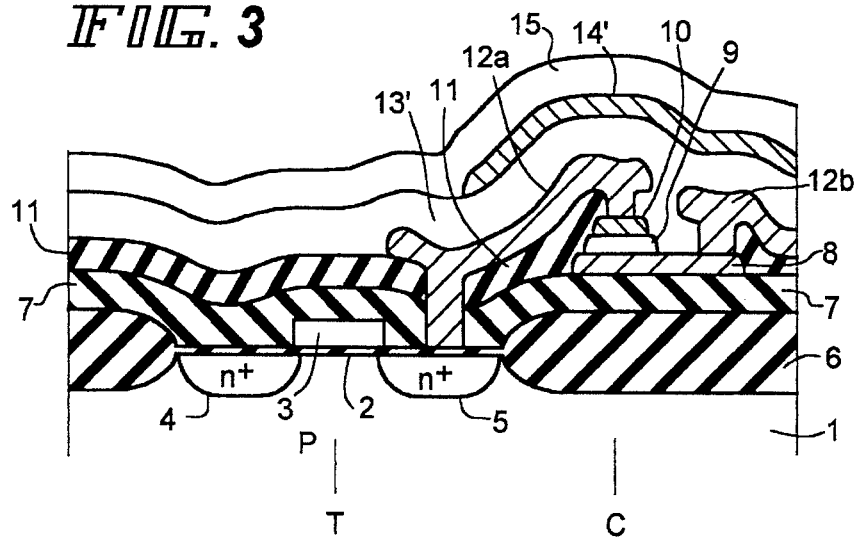
FIG. 3 is a cross section showing a structure of a semiconductor memory relating to a third embodiment of the present invention.

FIG. 3 is a cross section of a semiconductor memory relating to a third embodiment of the present invention. Moreover, like parts shown in FIG. 2 are represented by like reference symbols in FIG. 3 and their explanation is omitted.

A different point of this third embodiment from the second embodiment is to limit the formation region of a hydrogen barrier film 14' of a TiN film or TiON film to a range covering a storage capacitor. The significance of the hydrogen barrier film 14' lies in its humidity resistance, and may preferably be in hydrogen non-penetration and hydrogen non-permeability. A corrosion-resisting film 15 of an SiN film by a plasma CVD method or an SiO$_2$ film by a normal or reduced pressure CVD method on the hydrogen barrier film 14' invites generation of hydrogen in the film. Even if hydrogen penetrates into the sublayer of a laminated structure, it is sufficient if the hydrogen barrier film 14' shields hydrogen penetration the dielectric film 9. The hydrogen barrier film 14' shields hydrogen penetration within a range covering the storage capacitor structure. Hydrogen penetration through the lateral direction is almost no problem.

Figure 4A:
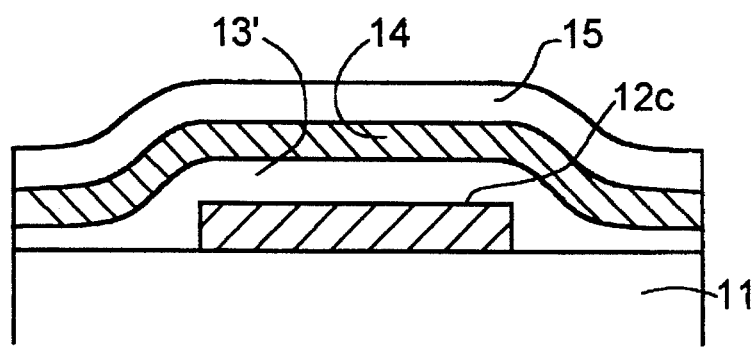
FIGS. 4(A) to (C) are cross sections showing a prior art connecting method of a pad portion and a bonding wire in the semiconductor memory.
Figure 4B:
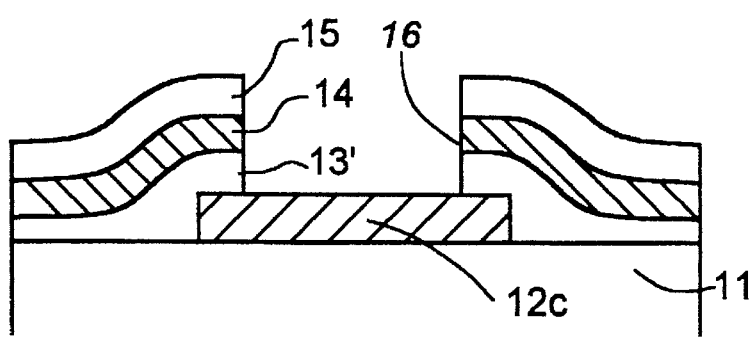
Figure 4C:
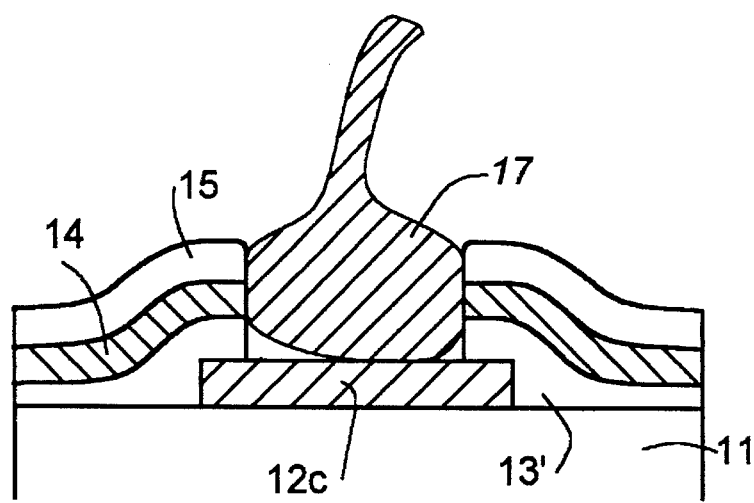

In the first and second embodiments, when the totally formed hydrogen barrier film 14 is a TiN film or a TiON film having a low oxygen content, the film is conductive, so that it is necessary to consider a method of connecting a pad portion formed on the same layer as the Al wiring 12b and a bonding wire. A general connecting method is shown in FIGS. 4(a)–(c). First, as shown in FIG. 4(B), three layers just above an Al pad portion 12c (see FIG. 4(A)) are removed by an etching treatment and a contact hole 16 is formed. Then, as shown in FIG. 4(C), a bonding wire 17 is pressed to an exposed region of the Al pad portion 12c. According to such a connecting method, the bonding wire 17 can be connected to not only the Al pad portion 12c but also to the conductive hydrogen barrier 14 in the side wall of the contact hole.

FIGS. 5(A)–(E) are cross sections showing an improved connecting method of a pad portion and a bonding wire in order to solve the above problem.

Figure 5A:
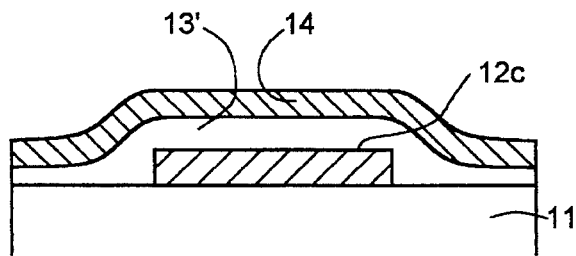
FIGS. 5(A) to (E) are cross sections showing an improved connecting method of a pad portion and a bonding wire in the semiconductor memory according to the present invention.

First, as shown in FIG. 5(A), on a second interlayer insulating film 11 is formed an Al pad portion 12c with the same layer as the Al wiring 12b, on which are successively formed a third interlayer insulating film 13' and a conductive hydrogen barrier film 14.

Figure 5B:
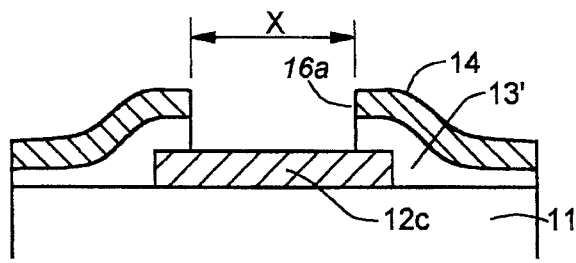

Second, as shown in FIG. 5(B), before formation of a corrosion-resisting film 15, three layers just above the Al pad portion 12c are removed by an etching treatment to form a window portion 16a, and the Al pad portion 12c has an exposed region having width X.

Figure 5C:
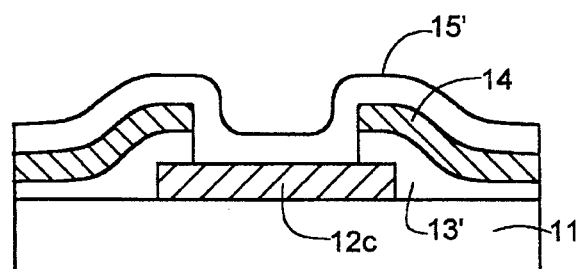

Third, as shown in FIG. 5(C), on the hydrogen barrier film 14 inclusive of the above exposed region X is formed a corrosion-resisting film 15'. Here, the inside of the contact hole 16a is covered with the corrosion-resisting film 15'.

Figure 5D:
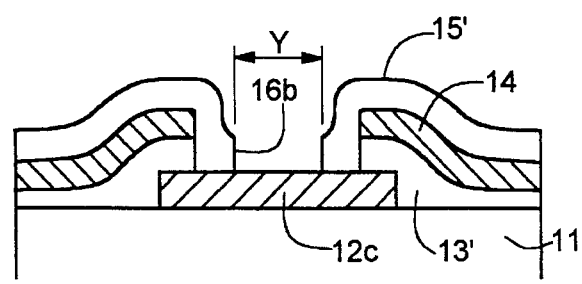

Fourth, as shown in FIG. 5(D), one layer of the corrosion-resisting film 15' just above the Al pad portion 12c is removed by etching and a contact hole 16b is formed. A width Y of the exposed region formed on the surface of the Al pad portion 12c is narrower than the width X of the above exposed region.

Figure 5E:
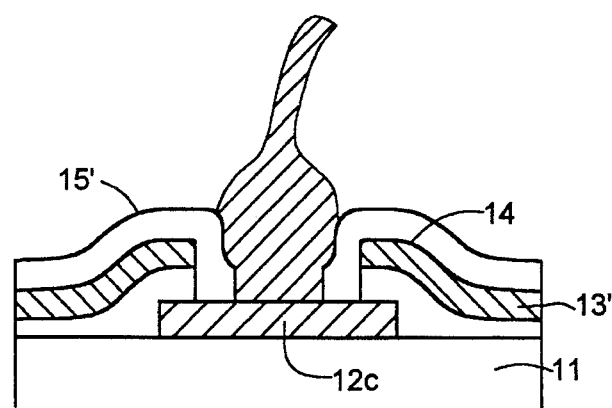
Figure 6:
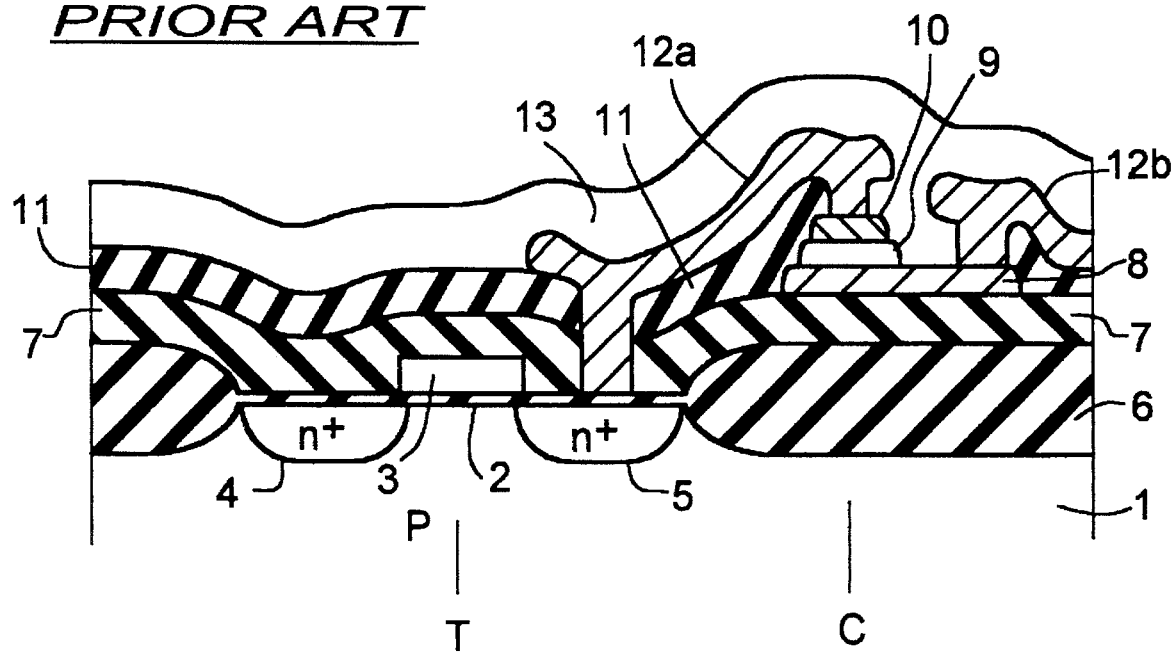
FIG. 6 is a cross section showing an embodiment of a prior art semiconductor memory.

Fifth, as shown in FIG. 5(E), a bonding wire 17 is pressed to the exposed region Y of the Al pad portion 12c.

When employing the above connecting method, the bonding wire 17 becomes conductive only to the Al pad portion 12c. Bonding wire 17 is not conductive to the conductive hydrogen barrier film 14 because the hydrogen barrier film 14 and the bonding wire 17 are insulated by the corrosion-resisting film 15'. Moreover, the above connecting method can be applied to a connection of the Al pad portion 12 and a bump, and to a connection of the Al wiring and the Al of the upper layer (through-hole connection).

The problem of property deterioration by hydrogen penetration is caused not only in a ferroelectric film, but also in CMOS integrated circuits having polycrystalline silicon gates. If a polycrystalline silicon gate touches hydrogen, the change of a threshold value will be a factor for worsening yield. Therefore, formation of a humidity-resistant hydrogen barrier film as a protective film of a ferroelectric film over a polycrystalline silicon gate contributes to the stability of the properties of the polycrystalline silicon gate.

As explained above, the present invention forms a humidity-resistant hydrogen barrier film such as a TiN film, TiON film and the like on the upper portion of a ferroelectric or a polycrystalline silicon gate of a semiconductor device by a hydrogen non-emission film forming method. Therefore, the following effects are performed.

Since the formation of a hydrogen barrier film does not generate hydrogen, there is no influence of hydrogen penetrating into a ferroelectric or a polycrystalline silicon gate. Moreover, after the hydrogen barrier film is formed, if a hydrogen emission film forming method is used or a semiconductor device is placed in a hydrogen atmosphere, the hydrogen barrier film prevents hydrogen from penetrating. Therefore, it is possible to avoid deterioration caused by the hydrogen penetration such as residual polarization of a ferroelectric or the lowering of a dielectric constant, or the change of a threshold value of a polycrystalline silicon gate and the like.

In the case of a corrosive hydrogen barrier, if a structure having a corrosion protective film is employed, corrosion of the hydrogen barrier can naturally be prevented, and even if the formation of the corrosion protective film is by a hydrogen emission film forming method, there is no problem with hydrogen penetrating into the ferroelectric or the polycrystalline silicon gate.

In the case of forming a TiON film having insulating properties as a humidity-resistant hydrogen barrier film, it is possible to obtain a structure having high hydrogen inhibition properties. Moreover, it is possible to eliminate an interlayer insulating film.

We claim:

1. A semiconductor device on a substrate comprising:

a transistor having source and drain regions in the substrate, a gate insulating film located over said substrate, and a gate electrode located over said gate insulating film;

a ferroelectric capacitor coupled to said transistor, said ferroelectric capacitor having upper and lower plate electrodes and ferroelectric dielectric film between said plate electrodes; and a pad;

a second insulating layer located over said pad;

a humidity-resisting hydrogen barrier film consisting of TiON located over said capacitor and said second insulating layer;

a contact hole located through said humidity-resisting hydrogen barrier film and said second insulating film to said pad; and a corrosion-resisting film located over said humidity-resisting hydrogen barrier film, in said contact hole and over a portion of said pad; and wherein said corrosion-resisting film insulates said humidity-resisting hydrogen barrier film from said contact hole.

2. The semiconductor device of claim 1 wherein said TiON has a low oxygen content causing said TiON to be conductive.

3. The semiconductor device of claim 1 wherein said TiON has a high oxygen content causing said TiON to be insulative.

4. The semiconductor device of claim 1 wherein said corrosion-resistant film comprises a compound selected from the group consisting of SiN and $SiO_2$.

5. The semiconductor device of claim 1 wherein said humidity-resisting hydrogen barrier film extends over said transistor.

6. The semiconductor device of claim 1 wherein said gate electrode comprises polycrystalline silicon.

7. The semiconductor device of claim 1 wherein said ferroelectric dielectric film comprises PZT.

8. The semiconductor device of claim 1 wherein said pad comprises aluminum.

9. The semiconductor device of claim 1 wherein an electrical contact is located within said contact hole and said corrosion-resisting film insulates said humidity-resisting hydrogen barrier film from said electrical contact.

10. The semiconductor device of claim 9 wherein said electrical contact is a bonding wire.

11. A portion of an integrated circuit including a bonding pad comprising:

an insulating layer located over said bonding pad;

a humidity-resisting hydrogen barrier layer consisting of TiON located over said insulating layer;

a contact hole located through said humidity-resisting hydrogen barrier layer and said insulating layer to said bonding pad; and a second insulating layer located over said humidity-resisting hydrogen barrier layer, in said contact hole and over a portion of said bonding pad;

wherein said second insulating layer insulates said contact hole from said humidity-resisting hydrogen barrier layer.

12. The integrated circuit portion of claim 11 wherein said pad comprises aluminum.

13. The integrated circuit portion of claim 11 wherein said insulating layer comprises SIN.

14. The integrated circuit portion of claim 11 wherein said second insulating layer is a corrosion-resisting film comprising a compound selected from the group consisting of SiN and $SiO_2$.

15. The integrated circuit portion of claim 11 wherein an electrical contact is located within said contact hole and wherein said second insulating layer insulates said humidity-resisting hydrogen barrier layer from said electrical contact.

16. The integrated circuit portion of claim 15 wherein said electrical contact is a bonding wire.

* * * * *